United States Patent
Kobayashi et al.

(10) Patent No.: US 10,916,687 B2
(45) Date of Patent: Feb. 9, 2021

(54) SILICA GLASS MEMBER, PROCESS FOR PRODUCING THE SAME, AND PROCESS FOR BONDING CERAMIC AND SILICA GLASS

(71) Applicant: COORSTEK KK, Tokyo (JP)

(72) Inventors: Hiroaki Kobayashi, Kanagawa (JP); Yu Yokoyama, Kanagawa (JP); Ramesh Vallepu, Kanagawa (JP); Hirotaka Hagihara, Kanagawa (JP)

(73) Assignee: COORSTEK KK, Tokyo (JP)

( * ) Notice: Subject to any disclaimer, the term of this patent is extended or adjusted under 35 U.S.C. 154(b) by 84 days.

(21) Appl. No.: 16/124,041

(22) Filed: Sep. 6, 2018

(65) Prior Publication Data

US 2019/0074416 A1    Mar. 7, 2019

(30) Foreign Application Priority Data

Sep. 6, 2017 (JP) .................................. 2017-170801
Jul. 26, 2018 (JP) .................................. 2018-140062

(51) Int. Cl.
*B23K 1/00* (2006.01)
*H01L 33/58* (2010.01)
(Continued)

(52) U.S. Cl.
CPC .......... *H01L 33/58* (2013.01); *B23K 35/3013* (2013.01); *C03C 8/16* (2013.01);
(Continued)

(58) Field of Classification Search
CPC ..... H01L 33/58; H01L 33/483; H01L 33/486; H01L 2933/0058; C03C 8/16; C03C 17/008; C03C 17/04; C03C 8/18; C03C 27/00; C03C 2217/479; C03C 2217/452; C03C 27/10; C04B 37/045; C04B 2237/76; C04B 2237/84; C04B 2237/86;
(Continued)

(56) References Cited

U.S. PATENT DOCUMENTS 3,793,064 A * 2/1974 Budd .................... H01L 23/057
257/703
6,319,617 B1 * 11/2001 Jin ....................... B23K 35/262
228/101

(Continued)

FOREIGN PATENT DOCUMENTS

FR         1328501 A  *  5/1963
JP         3658800 B2    6/2005
(Continued)

*Primary Examiner* — Kiley S Stoner
(74) *Attorney, Agent, or Firm* — Procopio, Cory, Hargreaves & Savitch LLP

(57) ABSTRACT

The present invention relates to a silica glass member including: a main body including a silica glass and having a bonding part for bonding to another member; and a bonding film which is provided on the bonding part, has a thickness of 0.2 μm to 10 μm, and includes Au and a glass formed through melting of glass frit, in which the bonding film is produced from Au powder having an average particle diameter of 3 μm or less and glass frit having a softening point of 850° C. or lower, a process for producing a silica glass member, and a process for bonding a ceramic and a silica glass.

3 Claims, 3 Drawing Sheets

(51) Int. Cl.
| | |
|---|---|
| *H01L 33/48* | (2010.01) |
| *C03C 27/00* | (2006.01) |
| *C22C 5/02* | (2006.01) |
| *B23K 35/30* | (2006.01) |
| *C03C 8/16* | (2006.01) |
| *C03C 17/00* | (2006.01) |
| *C04B 37/04* | (2006.01) |
| *C03C 17/04* | (2006.01) |
| *C03C 8/18* | (2006.01) |
| *B23K 35/02* | (2006.01) |

(52) U.S. Cl.
CPC ............. *C03C 8/18* (2013.01); *C03C 17/008* (2013.01); *C03C 17/04* (2013.01); *C03C 27/00* (2013.01); *C04B 37/045* (2013.01); *C22C 5/02* (2013.01); *H01L 33/483* (2013.01); *B23K 35/0233* (2013.01); *C03C 2217/452* (2013.01); *C03C 2217/479* (2013.01); *C04B 2235/6584* (2013.01); *C04B 2237/124* (2013.01); *C04B 2237/125* (2013.01); *C04B 2237/126* (2013.01); *C04B 2237/366* (2013.01); *C04B 2237/55* (2013.01); *C04B 2237/62* (2013.01); *C04B 2237/708* (2013.01); *C04B 2237/72* (2013.01); *C04B 2237/76* (2013.01); *C04B 2237/84* (2013.01); *C04B 2237/86* (2013.01); *H01L 33/486* (2013.01); *H01L 2933/0058* (2013.01)

(58) Field of Classification Search
CPC .......... C04B 2237/55; C04B 2237/125; C04B 2237/62; C04B 2237/126; C04B 2237/366; C04B 2237/72; C04B 2235/6584; C04B 2237/124; C04B 2237/708; C04B 37/047; C22C 5/02; B23K 35/3013; B23K 35/0233
USPC .................... 228/121–124.7, 248.1–248.5
See application file for complete search history.

(56) References Cited

U.S. PATENT DOCUMENTS

| | | | |
|---|---|---|---|
| 7,514,718 | B2 | 4/2009 | Shin et al. |
| 8,154,047 | B2* | 4/2012 | Suehiro ..................... C03C 8/24 257/100 |
| 2006/0049335 | A1* | 3/2006 | Suehiro ................... H01L 33/56 250/214.1 |
| 2006/0108594 | A1 | 5/2006 | Iwasaki et al. |

FOREIGN PATENT DOCUMENTS

| | | |
|---|---|---|
| JP | 2006-140281 A | 6/2006 |
| JP | 2006-344978 A | 12/2006 |
| JP | 2017-204599 A | 11/2017 |
| JP | 2018-006693 A | 1/2018 |

* cited by examiner

SILICA GLASS MEMBER, PROCESS FOR PRODUCING THE SAME, AND PROCESS FOR BONDING CERAMIC AND SILICA GLASS

FIELD OF THE INVENTION

The present invention relates to a silica glass member which can be easily bonded to ceramics, a process for producing the silica glass member, and a process for bonding a ceramic and a silica glass. More particularly, the present invention relates to a silica glass member, e.g., a cap or a lens, that can be tenaciously bonded to a housing formed of a ceramic and containing a light emitting diode (LED), a process for producing the silica glass member, and a process for bonding such two members.

BACKGROUND OF THE INVENTION

Hitherto, an LED has been used in such a manner that the LED is placed in a housing and embedded in a resin serving also as a lens or the housing containing the LED is closed with, for example, a glass lens with a resinous adhesive interposed therebetween. However, with respect to LEDs which emit ultraviolet light, there has been problems in that ordinary glasses are low in ultraviolet transmittance and the resinous lenses or adhesives are readily deteriorated by the ultraviolet light.

Silica glass has advantages in that high-purity grades are easy to produce and silica glass has excellent transparency to light including ultraviolet light and is not deteriorated by ultraviolet light, etc. Silica glass hence is a preferred material for caps, lenses, and the like for LEDs. However, it has been difficult to apply silica glass to LEDs which emit ultraviolet light because there are problems in that resinous adhesives, which are easy to handle, cannot be used therewith and that since silica glass has a low thermal expansion coefficient as compared with other members, bonding of silica glass to other members results in the occurrence of stress due to a difference in thermal expansion coefficient.

It has been proposed to use frit glass, solder, or the like as a sealing material for ultraviolet LEDs which is for fixing, for example, a cap or a lens to the housing and for sealing (see, for example, Patent Documents 1 and 2). However, with such a sealing material, it is difficult to bond a cap or lens including silica glass to a ceramic housing including aluminum oxide, aluminum nitride, or the like, and it has hence been difficult to airtightly enclose the LED. A technique which has frequently been used for coping with such problems is to employ a cap or lens that is made of an ultraviolet-transmitting glass other than silica glass or to perform bonding (fixing) with, for example, a resin having insufficient ultraviolet resistance (see, for example, Patent Documents 3 and 4). As a result, there have been cases where the light transparency is insufficient or the airtightness is impaired due to deterioration.

Patent Document 1: JP-A-2017-204599
Patent Document 2: JP-A-2018-006693
Patent Document 3: Japanese Patent No. 3658800
Patent Document 4: JP-A-2006-140281

SUMMARY OF THE INVENTION

A possible method for bonding a cap or lens made of silica glass to a housing made of a ceramic with a solder is to metallize the bonding surface of the cap or lens made of silica glass, in order to enhance the strength of bonding by soldering. However, since the bonded portion repeatedly undergoes heating and cooling, the mere metallization results in the occurrence of stress due to a difference in thermal expansion between the silica glass and the metallized film, leading to fracture in an early stage. In the case where Cr (chromium), which is the material of common metallized films, is to be deposited by vapor deposition, it is necessary to use an elevated deposition temperature in order to enhance adhesion. This deposition, however, is undesirable because at around ordinary temperature, at which the product is used, higher stress is imposed on the interface between the deposited metallized film and the silica glass. Specifically, a phenomenon occurs, for example, in which the film peels off or the cap or lens made of silica glass cracks, thereby affecting the LED. Thus, the conventional metallization has a problem concerning reliability.

Meanwhile, various methods have been proposed in which glass frit is used in place of a solder, but none of the proposals can tenaciously bond the ceramic to silica glass.

The present invention has been achieved in view of such problems. An object of the present invention is to provide a silica glass member capable of being satisfactorily bonded to other members, a process for producing the silica glass member, and a process for bonding a ceramic and a silica glass.

A silica glass member according to the present invention includes:

a main body including a silica glass and having a bonding part for bonding to another member; and a bonding film which is provided on the bonding part, has a thickness of 0.2 μm to 10 μm, and includes Au and a glass formed through melting of glass frit, in which the bonding film is produced from Au powder having an average particle diameter of 3 μm or less and glass frit having a softening point of 850° C. or lower.

A process for producing a silica glass member according to the present invention is a process for producing a silica glass member including: a main body including a silica glass and having a bonding part for bonding to another member; and a bonding film which is provided on the bonding part and includes Au and a glass formed through melting of glass frit, the process including:

forming a paste including an Au powder and glass frit into a film on the bonding part to form a paste film; and heating the paste film to bond to the main body, thereby forming the bonding film.

A process for bonding a ceramic and a silica glass according to the present invention includes:

a step in which a bonding part of the ceramic is metallized to form a housing metallized layer having a surface containing Au;

a step in which a paste layer including an Au powder and glass frit is formed on a bonding part of the silica glass;

a step in which the paste layer is heated to form a bonding film integrated with the silica glass; and a step in which an Au—Sn solder is interposed between the housing metallized layer and the bonding film and heated to bond the ceramic and the silica glass to each other.

According to the silica glass member of the present invention, the bonding part of the main body including a silica glass has a bonding film including Au and a glass. Since a silica glass is compatible with a glass and Au is compatible with solders, the bonding part can be satisfactorily bonded to other members.

Since the average particle diameter of the Au powder is regulated to 3 μm or less, it is possible to produce the bonding film at low temperatures.

Since the softening point of glass frit is regulated to 850° C. or lower, it is possible to produce the bonding film at low temperatures.

Since the thickness of the bonding film is regulated to 0.2 μm to 10 μm, the strength of the film itself can be maintained while attaining stress relaxation. Consequently, separation can be more effectively inhibited. The thickness of the bonding film is preferably 0.5 μm or more since it increases the stress relaxation effect.

The silica glass member of the present invention is especially suitable for use as a lens for an LED or a cap for an LED.

In cases when the bonding film has an Au content of 50% by mass or higher, this bonding film can have heightened strength of bonding to solders and can be inhibited from suffering separation. Incidentally, when using the reduced content of Au, it should be careful so that separation at the bonding interface with an Au—Sn solder does not occur.

In the silica glass member of the present invention, it is preferable that the bonding film has a surface which lies on the same plane since it is possible to certainly bond the silica glass member with the housing without a gap.

According to the process of the present invention for producing a silica glass member, the silica glass member of the present invention can be easily produced by forming a paste film including an Au powder and glass frit on the bonding part and heating the paste film to form a bonding film integrated with the silica glass.

The paste film can be easily produced by forming the paste into a film by screen printing, dipping, or brush application.

According to the process of the present invention for bonding a ceramic and a silica glass, it is possible to easily and tenaciously bond the ceramic and the silica glass to each other since the ceramic which has been metallized is bonded to the silica glass on which an Au-containing bonding film has been formed, with an Au—Sn solder interposed therebetween.

DETAILED DESCRIPTION OF THE INVENTION

Embodiments of the present invention are explained below in detail by reference to the drawings.

First Embodiment

Figure 1A:
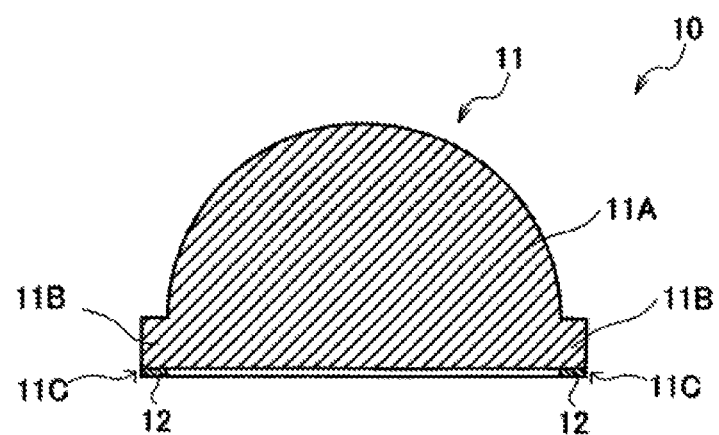
FIGS. 1A and 1B are views showing the configuration of an LED lens which is a silica glass member according to a first embodiment of the present invention.
Figure 1B:
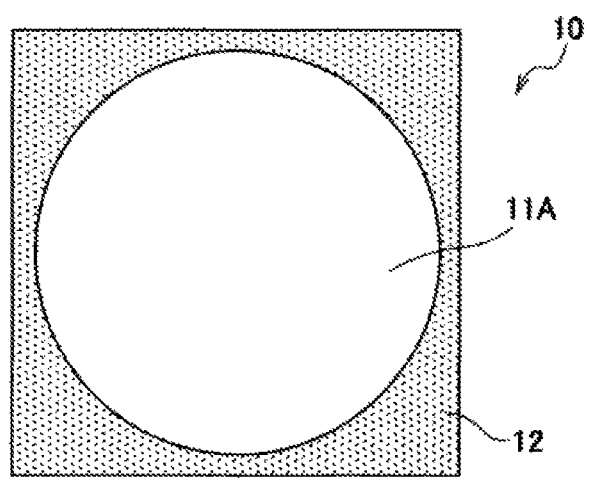
Figure 2A:
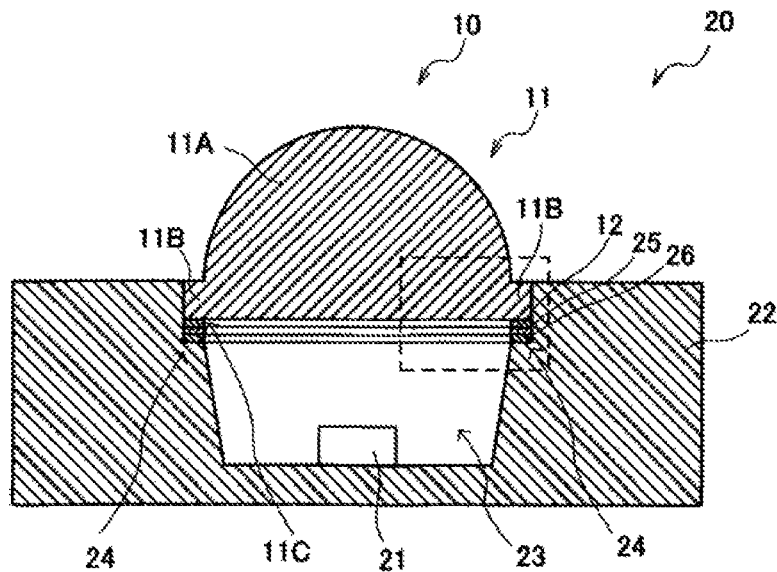
FIGS. 2A and 2B are cross-sectional views showing the configuration of an LED device employing the LED lens shown in FIGS. 1A and 1B.
Figure 2B:
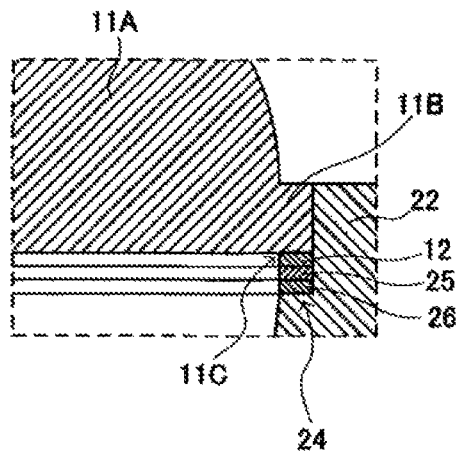

FIGS. 1A and 1B show the configuration of an LED lens 10 which is a silica glass member according to a first embodiment; FIG. 1A shows the configuration of a cross-section, and FIG. 1B shows the configuration viewed from under the silica glass member. FIGS. 2A and 2B show a cross-sectional structure of an LED device 20 employing the LED lens 10; FIG. 2A shows the overall configuration, and FIG. 2B is an enlarged view of the portion in FIG. 2A surrounded by broken lines.

This LED lens 10 includes a main body 11 including a silica glass. The main body 11 includes, for example, a lens part 11A, which has a hemispherical shape, and a flange part 11B disposed along the flat-surface-side periphery of the lens part 11A. For example, this LED lens 10 is fitted to a housing 22 in which an LED 21 has been disposed, as shown in FIGS. 2A and 2B.

The housing 22 has, for example, a recess 23 for disposing the LED 21 therein, and an upper portion of the recess 23 is provided with, for example, a stepped portion 24 for fitting the LED lens 10. The LED lens 10 is disposed, for example, in such a manner that the flange part 11B is brought into contact with the stepped portion 24 and the bottom surface of the flange part 11B is bonded to the upper surface of the stepped portion 24. Namely, in this LED lens 10, the bottom surface of the flange part 11B is a bonding part 11C for bonding to the housing 22, which is another member. The bottom surface of the flange part 11B and the upper surface of the stepped portion 24 are bonded to each other, for example, with a solder 25. This is for attaining airtight sealing. As the material of the solder 25, an Au—Sn solder is, for example, used. It is preferable that a housing metallized layer 26 has been formed on the upper surface of the stepped portion 24 in order to improve the wettability by the solder 25. Examples of the housing metallized layer 26 include a layer obtained by forming an Ni layer on the housing surface and forming an Au layer on the Ni layer.

A bonding film 12 including Au and a glass has been disposed on the bottom surface of the flange part 11B of the LED lens 10, i.e., on the bonding part 11C for bonding to another member. This is because the silica glass is less apt to be wetted by the solder 25 and the surface is hence metallized to improve the compatibility for the solder 25. The reason why Au is used in the bonding film 12 is that Au has a lower Young's modulus than Cr and is effective in reducing stress even when deposited at the same temperature as Cr. In addition, Au is extremely highly compatible with Au—Sn solders. The reason why the bonding film 12 contains a glass is that Au is difficult to deposit directly on the silica glass because of the poor wetting properties of Au and is hence adhered to the silica glass by the glass. In FIG. 1B, the portion where the bonding film 12 lies is indicated by dotting.

The bonding film 12 may be formed, for example, by applying a paste containing an Au powder and glass frit and heating and firing the applied paste. The glass frit melts and tightly adheres to the silica glass, and tenacious bonding can hence be obtained. The glass frit to be used has a softening point of preferably 850° C. or lower, more preferably 700° C. or lower. The paste is obtained, for example, by mixing glass frit particles and Au powder particles with a medium. As the medium of the paste, for example, ethyl diglycol acetate (ECA), butyl glycol acetate (BCA), butyl diglycol acetate (BDGA), cyclohexanone, toluene, isophorone, gamma-butyrolactone, benzyl alcohol, propylene glycol monomethyl ether acetate, terpineol and the like may be mentioned.

The Au powder preferably has an average particle diameter of 3 μm or less, and more preferably has an average particle diameter of 0.2 μm or less. This is because use of this Au powder makes it possible to produce the bonding film 12 at low temperatures. The Au powder paste containing glass frit preferably has a softening point of 850° C. or lower, and more preferably has a softening point of 700° C. or lower.

It is preferable that the bonding film 12 has an Au content of 50% by mass or higher. This is because such an Au content can improve the strength of bonding to the solder 25 and can enhance the effect of inhibiting separation. It is preferable that the bonding film 12 has an Au content of 90% by mass or less. This is because Au contents exceeding 90% by mass result in reduced glass contents and this bonding film 12 hence has reduced adhesion to the silica glass and is prone to peel off. The Au content thereof is more preferably 80% by mass or less.

The thickness of the bonding film 12 is preferably 0.2 μm to 10 μm. This is because the strength of the film itself can be maintained while attaining stress relaxation. The thickness of the bonding film 12 is more preferably 0.5 μm or more. It is preferable that the surface of the bonding film 12 lies on the same plane, from the standpoint of enabling the LED lens 10 to be easily and airtightly bonded to the housing 22 with the solder 25. With respect to the surface properties of the bonding part 11C, the surface roughness thereof is preferably 0.05 μm to 1 μm. The reasons for this are as follows. By regulating the surface roughness thereof to 0.05 μm or higher, the bondability of the bonding part 11C to the bonding film 12 can be improved. Meanwhile, too high surface roughness is undesirable because the bonding film 12 has unevenness in thickness.

Incidentally, the surface roughness can be measured by using a tracer type surface roughness meter.

This LED lens 10 can be produced, for example, in the following manner. First, the main body 11 is formed from a silica glass. Next, a paste film including an Au powder and glass frit is formed on the bonding part 11C of the main body 11. It is preferred to form this paste film by screen printing, dipping, brush application, or the like. In particular, screen printing is preferred. This is because a paste film having an even thickness can be formed easily and control of the film thickness is easy. The Au content in the paste is preferably 50% by mass or higher and is preferably 90% by mass or less, as stated above. Subsequently, the glass frit is melted, for example, by heating the paste film. Specifically, the main body 11 on which the paste film has been formed is fired to melt the glass frit. At this time, the Au powder may be melted or not melted, but in the case where the Au powder is melted, the bonding strength increases, which is more preferable.

This LED lens 10 is, for example, bonded to the housing 22 with a solder 25 as shown in FIGS. 2A and 2B. For example, a solder 25 in tape form is disposed on the stepped portion 24 of the housing 22 on which a housing metallized layer 26 has been formed, and the bonding part 11C of the flange part 11B, which has the bonding film 12 formed thereon, is brought into contact with the solder 25, thereby disposing the LED lens 10. This assemblage is heated in an oxygen-free atmosphere to melt the solder 25 to solder the LED lens 10 to the housing 22.

According to this embodiment, since a bonding film 12 including Au and a glass is disposed on the bonding part 11C of the main body 11 including the silica glass, the bonding part 11C can be made to have an improved compatibility with the solder 25 and can be satisfactorily bonded to the housing 22 which is another member.

By regulating the Au content in the bonding film 12 to 50% by mass or higher, the strength of bonding to the solder 25 can be enhanced and separation can be inhibited.

Furthermore, by regulating the thickness of the bonding film 12 to 0.2 μm to 10 μm, the strength of the film itself can be maintained while attaining stress relaxation. Separation can hence be more effectively inhibited.

In addition, since the bonding film 12 is formed on the bonding part 11C by forming a paste film including an Au powder and glass frit and then heating the paste film, the LED lens 10 can be easily produced.

Second Embodiment

Figure 3A:
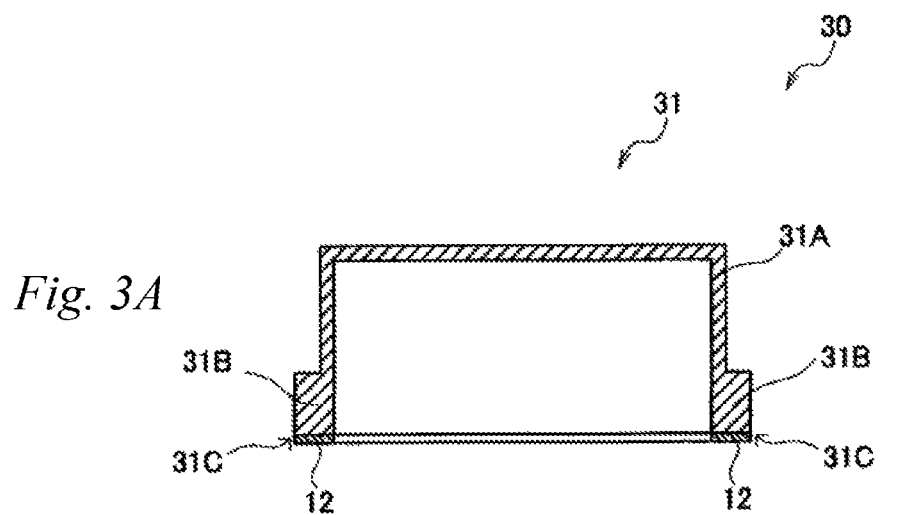
FIGS. 3A and 3B are views showing the configuration of an LED cap which is a silica glass member according to a second embodiment of the present invention.
Figure 3B:
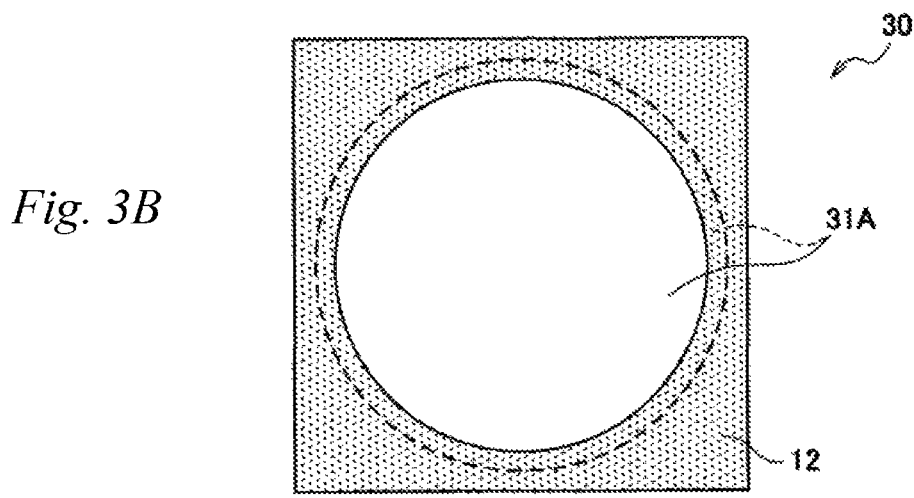

FIGS. 3A and 3B show the configuration of an LED cap 30 which is a silica glass member according to a second embodiment; FIG. 3A shows the configuration of a cross-section, and FIG. 3B shows the configuration viewed from under the silica glass member. This LED cap 30 has the same configuration as the LED lens 10 explained with regard to the first embodiment, except that the main body 31 has a different shape. Hence, like constituent elements are designated by like numerals or signs, and corresponding constituent elements are designated by numerals or signs in each of which the tens digit has been replaced by "3". Detailed explanations thereon are omitted.

The main body 31 includes a silica glass, and includes, for example, a cap part 31A, which has a cylindrical shape in which one end is closed, and a flange part 31B disposed at the open end of the cap part 31A. This flange part 31B corresponds to the flange part 11B of the first embodiment. As in the first embodiment, this flange part 31B is disposed on a stepped portion 24 of a housing 22, and the bottom surface of the flange part 31B is bonded to the upper surface of the stepped portion 24 (see FIGS. 2A and 2B). Namely, in this LED cap 30, the bottom surface of the flange part 31B is a bonding part 31C for bonding to the housing 22 which is another member. As in the first embodiment, a bonding film 12 has been disposed on the bottom surface of the flange part 31B of the LED cap 30, i.e., on the bonding part 31C for bonding to another member. In FIG. 3B, the portion where the bonding film 12 lies is indicated by dotting.

This LED cap 30 can be produced and used in the same manners as for the LED lens 10 explained above with regard to the first embodiment, and the same effect as the LED lens 10 can be obtained.

The silica glass to be used in the present invention may be one having a purity of 99% or higher, preferably 99.9% or higher. This silica glass has a heightened ultraviolet transmittance and is a stable material.

The average particle diameters of Au in the present invention are values determined by the laser diffraction/scattering method.

EXAMPLES

Example 1

An LED lens 10 such as that shown in FIGS. 1A and 1B was produced. First, a main body 11 made of a silica glass and including a hemispherical lens part 11A with a diameter of 3.5 mm and a flange part 11B having a square peripheral shape of 4×4 mm was produced. Next, a paste film including an Au powder and glass frit was formed by screen printing on the bottom surface of the flange part 11B, i.e., on the bonding part 11C. The Au powder had an average particle diameter of 0.2 μm, and the Au content was 65% by mass. The glass frit used was Bi-containing glass frit having a softening point of 450° C. The medium used was BCA. Subsequently, the main body 11 on which the paste film had been formed was fired in the air to melt the glass frit, thereby forming a bonding film 12. After the firing, the thickness of the bonding film 12 was measured with a laser microscope and was found to be 1 µm.

Meanwhile, a housing 22 made of aluminum nitride, such as that shown in FIGS. 2A and 2B, was prepared, and an Ni layer and an Au layer were deposited in this order on the upper surface of the stepped portion 24 to thereby form a housing metallized layer 26. Next, a square piece having a peripheral shape of 4×4 mm was punched out from a solder 25 in tape form having a thickness of 0.1 µm (Au—Sn solder including 80% by mass Au and 20% by mass Sn), and a hole having a diameter of 3.5 mm was formed in the center of the square piece by punching. This solder 25 was placed on the stepped portion 24. Subsequently, the bonding part 11C of the produced LED lens 10 was disposed over the stepped portion 24, with the solder 25 interposed therebetween, and the solder 25 was heated and melted at about 300° C. in an oxygen-free atmosphere to conduct soldering. After the soldering, it was ascertained that the LED lens 10 and the housing 22 made of aluminum nitride had been bonded to each other.

Example 2

A silica glass/aluminum nitride bonding test was conducted. A bonding film 12 having a thickness of 1 µm and including Au and a glass was formed on a silica glass plate with a diameter of 5.2 mm in the same manner as in Example 1. The Au content in the bonding film 12 was 65% by mass. Meanwhile, an Ni layer and an Au layer were deposited in this order on an aluminum nitride plate of 10×10 mm to form a housing metallized layer 26, in the same manner as in Example 1. Subsequently, the silica glass plate and the aluminum nitride plate were disposed so that the bonding film 12 of the former plate faced the housing metallized layer 26 of the latter plate, with a tape-shaped solder 25 (Au—Sn solder) having a thickness of 0.1 µm interposed therebetween. The two plates were soldered in the same manner as in Example 1. The sample obtained was examined by fixing a stud pin to the surface of the silica glass plate and the adhesion strength of the sample was measured with a stud pin type vertical tensile tester. As a result, the adhesion strength was 50 MPa and the surface of the silica glass plate cracked. However, no separation was observed at the bonding interface.

Example 3

An experiment was conducted under the same conditions as in Example 1, except that glass frit having a softening point of 800° C. was used. As a result, the LED lens was able to be tenaciously bonded to the housing.

Example 4

An experiment was conducted under the same conditions as in Example 1, except that an Au powder having an average particle diameter of 3 µm was used. As a result, the LED lens was able to be tenaciously bonded to the housing.

Example 5

An experiment was conducted under the same conditions as in Example 1, except that an Au powder having an average particle diameter of 0.02 µm was used. As a result, the LED lens was able to be tenaciously bonded to the housing.

Example 6

An experiment was conducted under the same conditions as in Example 1, except that the Au powder content in the bonding film was changed to 55%. As a result, the LED lens was able to be tenaciously bonded to the housing.

Example 7

An experiment was conducted under the same conditions as in Example 1, except that the Au powder content in the bonding film was changed to 85%. As a result, the LED lens was able to be tenaciously bonded to the housing.

Example 8

An experiment was conducted under the same conditions as in Example 1, except that the thickness of the bonding film was changed to 0.5 µm. As a result, the LED lens was able to be tenaciously bonded to the housing.

Example 9

An experiment was conducted under the same conditions as in Example 1, except that the thickness of the bonding film was changed to 10 µm. As a result, the LED lens was able to be tenaciously bonded to the housing.

Comparative Example 1

A main body 11 made of a silica glass and including a lens part 11A and a flange part 11B was produced in the same manner as in Example 1. Next, a Cr layer was deposited in a thickness of 0.1 µm on the bottom surface (bonding part 11C) of the flange part 11B by vacuum deposition plating, and an Au layer was deposited in a thickness of 0.1 µm on the surface of the Cr by vacuum deposition plating. This LED lens also was soldered with a solder 25 to a housing 22 on which a housing metallized layer 26 had been formed, in the same manner as in Example 1. The solder 25 was one obtained by punching out from a tape-shaped Au—Sn solder having a thickness of 0.3 µm, in the same manner as in Example 1. As a result, separation and cracking occurred at the bonding interface between the LED lens and the housing 22 after cooling.

Comparative Example 2

An experiment was conducted under the same conditions as in Example 1, except that glass frit having a softening point of 900° C. was used. As a result, after the paste firing, the sidewall of the flange part 11B cracked. The sidewall was unable to withstand the internal stress of the bonding layer because of an elevated firing temperature.

Comparative Example 3

An experiment was conducted under the same conditions as in Example 1, except that an Au powder having an average particle diameter of 4 µm was used. Firing was conducted at 900° C. because the increase in particle diameter necessitated a higher paste firing temperature. The firing conducted at 900° C. resulted in cracking in the sidewall of the flange part 11B.

Comparative Example 4

An experiment was conducted under the same conditions as in Example 1, except that the bonding film was polished to have a thickness of 0.1 µm. As a result, the flange part 11B cracked after bonding with an Au—Sn solder and subsequent cooling. It is thought that the too small thickness of the bonding film resulted in insufficient stress relaxation during the bonding with the Au—Sn solder and this resulted in the cracking due to tensile stress imposed on the lens flange part.

Comparative Example 5

An experiment was conducted under the same conditions as in Example 1, except that the bonding film had a thickness of 11 µm. As a result, because of the too large bonding-film thickness, the bonding film formed through screen printing was slightly wavy to have impaired flatness. Although the bonding film in this state was bonded with an Au—Sn solder, the recessed portions of the bonding film remained unbonded, resulting in voids. Air leakage hence occurred through the bonding interface, and airtight sealing was impossible.

Summary of the Examples and Comparative Examples

A satisfactory bonded state was obtained in Example 1, whereas Comparative Example 1 failed to attain satisfactory bonding. This is thought to be because Au is more effective in reducing stress than Cr. In Example 2, sufficient bonding strength was obtained. It was hence understood that high bonding strength is obtained by providing a bonding film 12 including Au and a glass to the bonding part 11C.

It was also understood from the other Examples and Comparative Examples that there are preferred ranges of the softening point of the glass frit, size of the Au particles, and thickness of the bonding film, from the standpoint of attaining tenacious bonding without leaving stress in the bonding part.

While the present invention has been described with reference to embodiments thereof, the invention should not be construed as being limited to the embodiments and can be variously modified. For example, although an LED lens 10 and an LED cap 30 were explained, in the embodiments, as examples of the silica glass member which are members for light sources, the silica glass member of the present invention is applicable also as members for other light sources. Applications thereof are not limited to members for light sources, and the silica glass member of the present invention is applicable as other silica glass members including optical windows for optical appliances and the lids of quartz oscillators.

Furthermore, although the configurations of the LED lens 10 and LED cap 30 in the embodiments were explained in detail, the LED lens 10 and the LED cap 30 may have other configurations. For example, although the flange parts 11B and 31B in the embodiments and Examples described above had a square peripheral shape, the peripheral shape thereof may be circular or may be a polygonal shape other than square. The flange parts 11B and 31B may be omitted; in this case, the flat-surface-side periphery of the lens part 11A or the open end of the cap part 31A can be used as a bonding part 11C or 31C for bonding to a housing 22 as another member. Furthermore, the shape of the lens and the shape of the cap may be suitably selected according to need. The bonding film may be formed so as to have a gradient along the thickness direction. For example, multiple kinds of pastes may be prepared and applied successively in order to form a paste film in which a silica-glass-side portion has a high glass proportion and a surface-side portion has a high Au proportion.

The present application is based on Japanese patent application No. 2017-filed on Sep. 6, 2017, and Japanese patent application No. 2018-140062 filed on Jul. 26, 2018, and the contents of which are incorporated herein by reference.

The silica glass member of the present invention is usable especially as members for ultraviolet light sources, etc.

DESCRIPTION OF REFERENCE NUMERALS AND SIGNS

10 . . . LED lens, 11 . . . main body, 11A . . . lens part, 11B . . . flange part, 11C . . . bonding part, 12 . . . bonding film, 21 . . . LED, 22 . . . housing, 23 . . . recess, 24 . . . stepped portion, 25 . . . solder, 26 . . . housing metallized layer, 30 . . . LED cap, 31 . . . main body, 31A . . . cap part, 31B . . . flange part, 31C . . . bonding part.

What is claimed is:

1. A silica glass member comprising:
a main body comprising a silica glass and having a bonding part for bonding to another member; and
a bonding film which is provided on the bonding part, has a thickness of 0.2 µm to 10 µm, and comprises Au and a glass formed through melting of glass frit,
wherein the bonding film is produced from Au powder having an average particle diameter of 3 µm or less and glass frit having a softening point of 850° C. or lower, and
the main body is a lens for an LED or a cap for an LED.

2. The silica glass member according to claim 1, wherein the bonding film has an Au content of 50% by mass or higher.

3. The silica glass member according to claim 1, wherein the thickness of the bonding film is 0.5 µm to 10 µm.

* * * * *